United States Patent
Kurohori

(10) Patent No.: US 8,461,555 B2
(45) Date of Patent: Jun. 11, 2013

(54) CHARGED PARTICLE BEAM WRITING METHOD AND CHARGED PARTICLE BEAM WRITING APPARATUS

(75) Inventor: Takeshi Kurohori, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 597 days.

(21) Appl. No.: 12/706,207

(22) Filed: Feb. 16, 2010

(65) Prior Publication Data
US 2010/0209833 A1  Aug. 19, 2010

(30) Foreign Application Priority Data

Feb. 18, 2009  (JP) ................................. 2009-035275

(51) Int. Cl.
G03F 7/20 (2006.01)
G21K 5/04 (2006.01)

(52) U.S. Cl.
USPC ................... 250/492.22; 250/492.3; 250/310; 250/396 R; 430/31

(58) Field of Classification Search
USPC .............. 250/304, 307, 309, 310, 311, 317.1, 250/318, 396 R, 398, 396 ML, 492.1, 492.21, 250/492.22, 492.3, 526; 430/30, 31, 32
See application file for complete search history.

(56) References Cited

U.S. PATENT DOCUMENTS

| | | | |
|---|---|---|---|
| 6,248,487 B1 * | 6/2001 | Cohn et al. ...................... 430/30 |
| 6,870,172 B1 * | 3/2005 | Mankos et al. .......... 250/492.22 |
| 7,566,882 B1 * | 7/2009 | Hess .............................. 250/400 |
| 7,755,061 B2 * | 7/2010 | Grella et al. .............. 250/396 R |
| 2009/0114837 A1 * | 5/2009 | Grella et al. .............. 250/396 R |
| 2010/0270475 A1 * | 10/2010 | Shinkawa et al. ............. 250/397 |

FOREIGN PATENT DOCUMENTS

| | | |
|---|---|---|
| JP | 9-260247 | 10/1997 |
| JP | 9-293670 | 11/1997 |
| JP | 2007-43083 | 2/2007 |

* cited by examiner

Primary Examiner — Bernard E Souw
(74) Attorney, Agent, or Firm — Oblon, Spivak, McClelland, Maier & Neustadt, L.L.P.

(57) ABSTRACT

Based on the pattern writing data input to an input unit 20, a control computer 19 divides a predetermined region on which writing is effected by an electron beam 54 into smaller regions each consisting of one or the same number of frames and determines the areal density of a pattern to be written on each smaller region. A drift compensation time interval determining unit 32 then determines the amount of change in pattern areal density between each two adjacent smaller regions, and groups the smaller regions in the predetermined region into region groups depending on whether or not the amount of change is greater than a predetermined value. A time profile for compensating for the drift of the electron beam 54 is then determined for each region group.

4 Claims, 4 Drawing Sheets

CHARGED PARTICLE BEAM WRITING METHOD AND CHARGED PARTICLE BEAM WRITING APPARATUS

BACKGROUND OF THE INVENTION

1. Field of the Invention

The present invention relates to a charged particle beam writing method and a charged particle beam writing apparatus.

2. Background Art

Recently, along with the development of higher levels of integration in semiconductor devices, the dimensions of the individual component devices have decreased and so has the width of wires and gates making up these components.

Photolithographic techniques which help achieve such miniaturization include the following sequential processes: applying a resist material to the surface of the substrate to be processed to form a resist film; irradiating the substrate with light or an electron beam to expose a predetermined resist pattern to form a latent image; heating the substrate as necessary; developing the pattern to form a micropattern; and etching the substrate using this micropattern as a mask.

In photolithography, the minimum width of a wiring pattern, etc. that can be resolved is proportionally dependent on the wavelength of the exposure light. Therefore, as one means of allowing miniaturization of patterns, effort has been made to reduce the wavelength of the exposure light used to form the above resist pattern latent image. Further, the development of electron beam lithography, which serves as a higher resolution exposure technique, has also been in progress. This technique inherently provides a superior resolution, since it uses electron beams, which are charged particle beams. Further, electron beam lithography is also advantageous in that great depth of focus is obtained, which enables dimensional variations to be reduced even when a large step feature is encountered. For this reason, the technique has been applied to the development of state-of-the-art devices typified by DRAM, as well as to the production of some ASICs. Further, electron beam lithography is widely used in the manufacture of masks or reticles used as original artwork for transferring an LSI pattern to the wafer.

Japanese Laid-Open Patent Publication No. 9-293670 (1997) discloses a variable shape electron beam writing apparatus used for electron beam photolithography. Such apparatus prepares pattern writing data by using design data (CAD data) of a semiconductor integrated circuit designed by a CAD system and processing it, such as correcting the data and dividing the pattern. For example, the division of the pattern into pattern segments is made on the basis of the maximum shot size, which is defined by the size of the electron beam. After this division of the pattern, the apparatus sets the coordinate positions and size of each shot and the radiation time. Pattern writing data is then produced which is used to shape the shot in accordance with the shape and size of the pattern or pattern segment to be written. The pattern writing data is divided on the basis of strip-shaped frames (or main deflection regions), and each frame is divided into sub-deflection regions. That is, the pattern writing data for the entire chip has a hierarchical data structure in which data of each of a plurality of strip-shaped frames, which correspond to the main deflection regions, is divided into a plurality of pieces of data each representing one of the plurality of sub-deflection regions (smaller in size than the main deflection regions) in the frame.

The sub-deflector scans the electron beam over the sub-deflection regions at higher speed than the main deflection regions; the sub-deflection regions are generally the smallest writing fields. When writing on each sub-deflection region, the shaping deflector forms a shot of a size and shape corresponding to the pattern or pattern segment to be written. Specifically, the electron beam emitted from the electron gun is shaped into a rectangular shape by the first aperture and then projected to the second aperture by the shaping deflector, resulting in a change in the shape and size of the beam. The electron beam is then deflected by the sub-deflector and the main deflector and directed onto the mask placed on the stage, as described above.

Incidentally, irradiating the mask with the electron beam results in generation of reflection electrons. These generated reflection electrons impinge onto the optical system, detectors, etc. in the electron beam writing apparatus, and as a result, charges are built up, thereby generating a new electric field. This changes the path of the electron beam that has been deflected toward the mask, resulting in displacement of the beam impinging position from the desired target position on the mask, which is referred to as "beam drift." Although other problems can cause beam drift, in any case it is necessary to make corrections to cause the beam to impinge at the desired location by detecting the reference mark position on the stage in the middle of the writing operation and determining the amount of beam drift.

Conventional methods make the above corrections or calibrations at predetermined time intervals. This means that in order to reduce the amount of displacement of the electron beam impinging position due to drift, it is effective to reduce the time intervals at which the drift compensation is made. In this case, however, a reduction in the throughput results. To overcome this problem, the compensation intervals may be shortened at the start and end of the writing operation, at which there is a great change in the amount of drift. However, this means that the traveling speed of the stage is not constant, making it difficult to estimate the time of completion of the writing operation.

On the other hand, Japanese Laid-Open Patent Publication No. 9-260247 (1997) discloses a method of drift compensation including: dividing the pattern into a plurality of regions based on the allowable displacement range of the electron beam over these regions; determining the largest rate of change of displacement of the electron beam due to drift over these regions; and determining, based on the above largest rate of change and the above allowable displacement range and for each of the plurality of regions, the time intervals at which to make a drift compensation.

The method disclosed in this publication measures the amount of drift in one operation and then estimates the amount of drift and its direction that will occur in the next measurement operation and corrects the electron beam impinging position accordingly. It will be noted that this estimation is easy if the areal density of the pattern to be written is constant, i.e., the area of the portion of the pattern in each individual writing region is equal. However, the estimation is difficult if the areal density of the pattern varies from one writing region to another. However, the estimation is difficult if the areal density of the pattern varies. The above publication only discloses a method of determining the time intervals at which to make a drift compensation for each writing region in the pattern writing field and therefore fails to provide a technique for improving the writing accuracy of the electron beam writing apparatus.

The present invention has been made in view of the above problems. It is, therefore, an object of the present invention to provide an electron beam writing method and an electron beam writing apparatus capable of writing with high accuracy by improving the accuracy of the drift compensation while preventing a reduction in the throughput.

SUMMARY OF THE INVENTION

According to one aspect of the present invention, in a method of writing with a charged particle beam, a predetermined region on which writing is effected by the charged particle beam is divided into smaller regions each consisting of one or the same number of frames, and the areal density of a pattern to be written on each smaller region is determined. The amount of change in pattern areal density between each two adjacent smaller regions is determined, and the smaller regions in the predetermined region are grouped into region groups depending on whether nor not the amount of change is greater than a predetermined value. For each region group, a time profile for compensating for the drift of the charged particle beam is determined. A pattern on the predetermined region is written while compensating for the drift of the charged particle beam for each region group in accordance with the time profile.

According to another aspect of the present invention, in a charged particle beam writing apparatus which divides a predetermined region on which writing is effected by a charged particle beam into a plurality of region groups and writes a pattern on the predetermined region while compensating for the drift of the charged particle beam in accordance with a time profile for compensating for the drift of the charged particle beam, the time profile being determined for each region group, the charged particle beam writing apparatus comprises grouping means for dividing the predetermined region into smaller regions each consisting of one or the same number of frames, obtaining data indicative of the areal density of a pattern to be written on each smaller region, determining the amount of change in pattern areal density between each two adjacent smaller regions, and grouping the smaller regions into region groups depending on whether or not the amount of change is greater than a predetermined value.

DETAILED DESCRIPTION OF THE EMBODIMENTS

An electron beam writing method of an embodiment of the present invention begins by dividing a predetermined region on which writing is effected by an electron beam into smaller regions each consisting of one or the same number of frames. The method then determines the areal density of a pattern to be written on each smaller region. The next step determines the amount of change in pattern areal density between each two adjacent smaller regions, and groups these smaller regions into region groups depending on whether or not the amount of change in pattern areal density is greater than a predetermined value. The method then determines, for each region group, a time profile for compensating for the drift of the electron beam. It should be noted that in this specification, if the pattern areal density in one region is lower than that in the preceding region, the amount of change in pattern areal density between these regions is defined to be negative. On the other hand, if the pattern areal density in one region is higher than that in the preceding region, then the amount of change in pattern areal density between these regions is defined to be positive.

Figure 1:
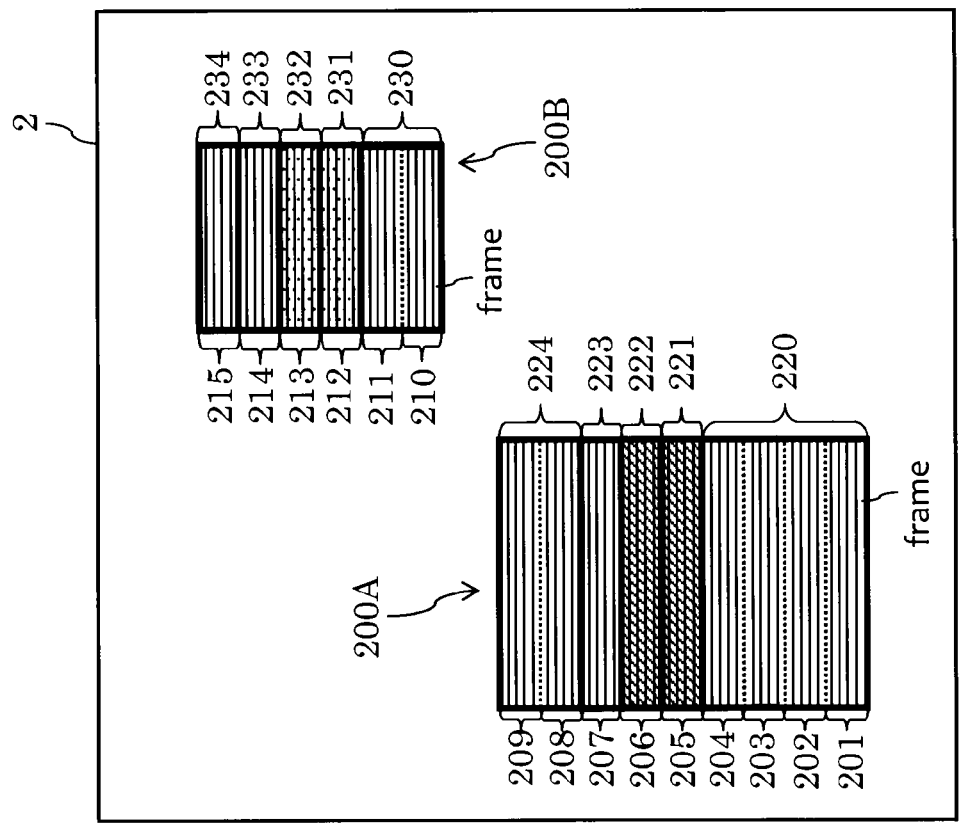
FIG. 1 is a schematic plan view of a mask.

FIG. 1 is a schematic plan view of a mask. Referring to FIG. 1, a first region 200A and a second region 200B on the mask 2 are areas on which writing is effected by an electron beam. The writing operation on the first region 200A precedes that on the second region 200B. The first and second regions 200A and 200B are divided into small regions 201 to 209 and small regions 210 to 215, respectively, defined by broken lines in FIG. 1. It should be noted that although in this example each small region consists of 5 frames, each small region may consist of any positive integer number of frames. According to the present embodiment, the areal density of the pattern to be written is determined on a small region basis. This determination may be made by calculation, i.e., finding the actual areal density value; or alternatively the pattern areal density may be determined visually without resorting to calculation. In the example shown in FIG. 1, small regions 201 to 204 and 207 to 209 have the same pattern areal density, and small regions 205 and 206 also have the same pattern areal density which, however, is different from the pattern areal density of the small regions 201 to 204 and 207 to 209. Likewise, small regions 210, 211, 214, and 215 have the same pattern areal density, and small regions 212 and 213 also have the same pattern areal density which, however, is different from the pattern areal density of the small regions 210, 211, 214, and 215. It will be noted that the pattern to be written is not shown in FIG. 1.

Next, a determination is made of the amount of change in pattern areal density between each two adjacent small regions. For example, the amount of change in pattern areal density is zero between the small regions 201 and 202, but not zero between the small regions 204 and 205. In this case, if the pattern areal density of the small region 204 is lower than that of the small region 205, then the amount of change in pattern areal density between these regions is positive. Likewise, the amount of change in pattern areal density between the small regions 206 and 207 is negative. It should be noted that if the small region 209 is the last small region in the first region 200A on which the writing is to be performed and the small region 210 is the first small region in the second region 200B on which the writing is to be performed, then these small regions 209 and 210 are regarded as being adjacent each other. Therefore, the amount of change in pattern areal density between these small regions 209 and 210 is also determined.

Next, the small regions in the first and second regions 200A and 200B are grouped into region groups based on the determination of whether or not the amount of change in pattern areal density between each two adjacent small regions is zero. In FIG. 1, the region groups in the first region 200A are denoted by reference numerals 220 to 224, and those in the second region 200B are denoted by 230 to 234.

The pattern writing is first performed on a selected small region, and then if the next small region on which the writing is to be subsequently performed has the same pattern areal density as the current small region, then the amount of drift is measured on the current small region, and the target electron beam impinging position for the next small region is corrected based on the estimated amount of drift and its direction on the next small region. If the next small region has a different pattern areal density than the current small region, on the other hand, it is difficult to estimate the amount of drift on the next small region in the manner described above. To overcome this problem, the time intervals at which the drift compensation is performed are made shorter in the latter case than in the former.

For example, in the first region 200A, the small regions 201 and 202 have the same pattern areal density. Further, the small regions 202, 203, and 204 also have the same pattern areal density. However, there is a change in pattern areal density between the small region 204 and the small region 205. Further, the small regions 205 and 206 have the same pattern areal density, but there is a change in pattern areal density between the small regions 206 and 207. On the other hand, the small regions 207, 208, and 209 have the same pattern areal density. That is, the region groups on which it is difficult to estimate the amount of drift and its direction are the region groups 221 and 223, since they have a different pattern areal density than their preceding region groups.

Further, in the second region 200B, the small regions 210 and 211 have the same pattern areal density, but there is a change in pattern areal density between the small regions 211 and 212. The small regions 212 and 213 have the same pattern areal density, but there is a change in pattern areal density between the small regions 213 and 214. Further, the small regions 214 and 215 have the same pattern areal density. That is, the region groups on which it is difficult to estimate the amount of drift and its direction are the region groups 231 and 233, since they have a different pattern areal density than their preceding region groups.

As described above, the drift compensation time profile is determined to be such that each region group having a different pattern areal density than the preceding region group is subjected to drift compensation at shorter intervals than region groups having the same pattern areal density as their preceding region groups. For example, referring to FIG. 1, the drift compensation on the region groups 220, 222, and 224 may be made at 20 min. intervals, and the drift compensation on the groups 221 and 223 may be at 5 min. intervals. Likewise, the drift compensation on the region groups 230, 232, and 234 may be made at 20 min. intervals, and the drift compensation on the region groups 231 and 233 may be at 5 min. intervals. It should be noted that although in this example the small regions 209 and 210 have the same pattern areal density, they may have different pattern areal densities. In the case where there is a change in pattern areal density between the small regions 209 and 210, the drift compensation on the region group 230 is made at shorter intervals than that on the region group 224.

Thus, the drift compensation on the region groups 221, 223, 231, and 233 are made at shorter time intervals, since it is difficult to estimate the amount of drift and its direction on these groups. This allows the writing accuracy to be improved, as compared to when the drift compensation is made at longer time intervals. On the other hand, since it is easy to estimate the amount of drift and its direction on the region groups 220, 222, 224, 230, 232, and 234, the drift compensation on these groups is made at longer time intervals, thereby preventing a reduction in the throughput.

It should be noted that in the above example, the small regions 201 to 204 have the same pattern areal density and so do the small regions 207 to 209 and so do the small regions 205 and 206. Further, the small regions 210, 211, 214, and 215, and the small regions 202, 203 have the same pattern areal density and so do the small regions 212 and 213. With this arrangement, these small regions are grouped into region groups depending on whether or not the absolute value of the amount of change in pattern areal density between each two adjacent small regions is zero. However, according to the present embodiment, the areal pattern densities of the small regions 201 to 204 (as well as other small regions) may not be the same. In this case, the small regions are grouped into region groups depending on whether or not the amount of change in pattern areal density between each two adjacent small regions is greater than a predetermined value, and drift compensation time intervals are determined for each region group in the manner described above. In practice, the above amount of change in pattern areal density is rarely zero and therefore the grouping may be made using a near-zero value as the above predetermined value.

According to the present embodiment, the drift compensation time intervals for each small region in a region group may be set differently. Specifically, in the above example, drift compensation time intervals are set only for each region group, so that the drift compensation time intervals for each small region in the region group are the same. However, according to the present embodiment, each region group may be divided into smaller groups or regions, and the drift compensation time intervals are set for each such smaller group or region. In other words, in this case the drift compensation time intervals for each region group vary with the pattern areal density of each smaller group or region in the region group. The time profile of the present embodiment for drift compensation includes both cases.

Figure 2:
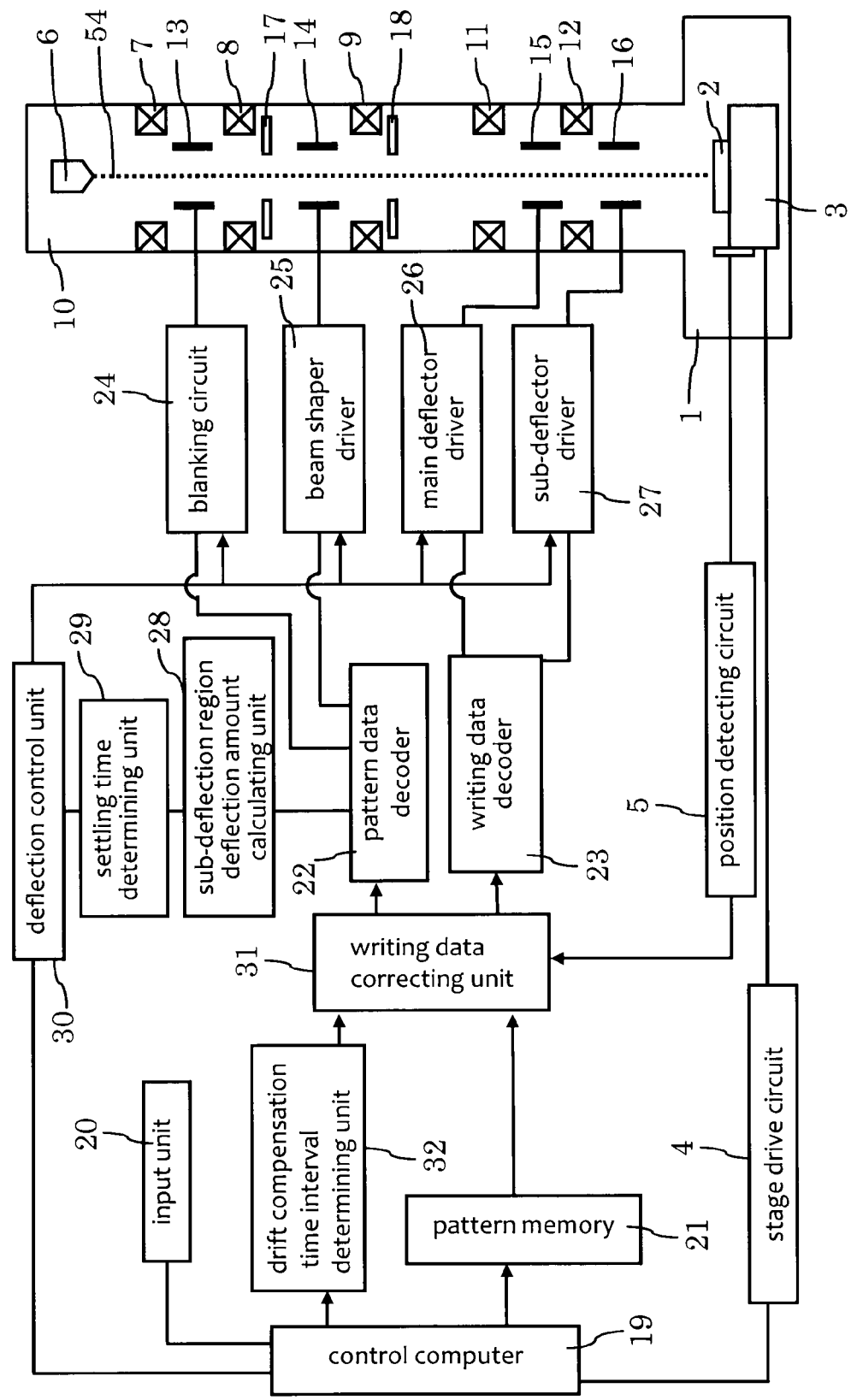
FIG. 2 is a diagram showing the configuration of an electron beam writing apparatus according to the present embodiment.

FIG. 2 is a diagram showing the configuration of an electron beam writing apparatus according to the present embodiment.

This electron beam writing apparatus includes a writing unit for writing on a workpiece with an electron beam, and a control unit for controlling the writing operation, as shown in FIG. 2. A writing chamber 1 houses a stage 3 on which a mask 2 (a workpiece) is mounted. The mask 2 is a structure in which a chromium film serving as a light shielding film is formed on a transparent glass substrate of quartz, etc. and a resist film is formed on the chromium film, for example. According to the present embodiment, writing is effected on this resist film by an electron beam. A stage drive circuit 4 causes the stage 3 to move in the X-direction (i.e., the lateral direction as viewed in FIG. 2) and the Y-direction (i.e., the direction perpendicular to the plane of the paper). The position of the stage 3 is measured by a position detecting circuit 5 using a laser-based measuring device, etc.

An electron beam optical system 10 is disposed above the writing chamber 1. The electron beam optical system 10 includes an electron gun 6, various lenses 7, 8, 9, 11, and 12, a blanking deflector 13, a shaping deflector 14, a main deflector 15 and a sub-deflector 16 for beam scanning, and two beam shaping apertures 17 and 18, etc.

Figure 3:
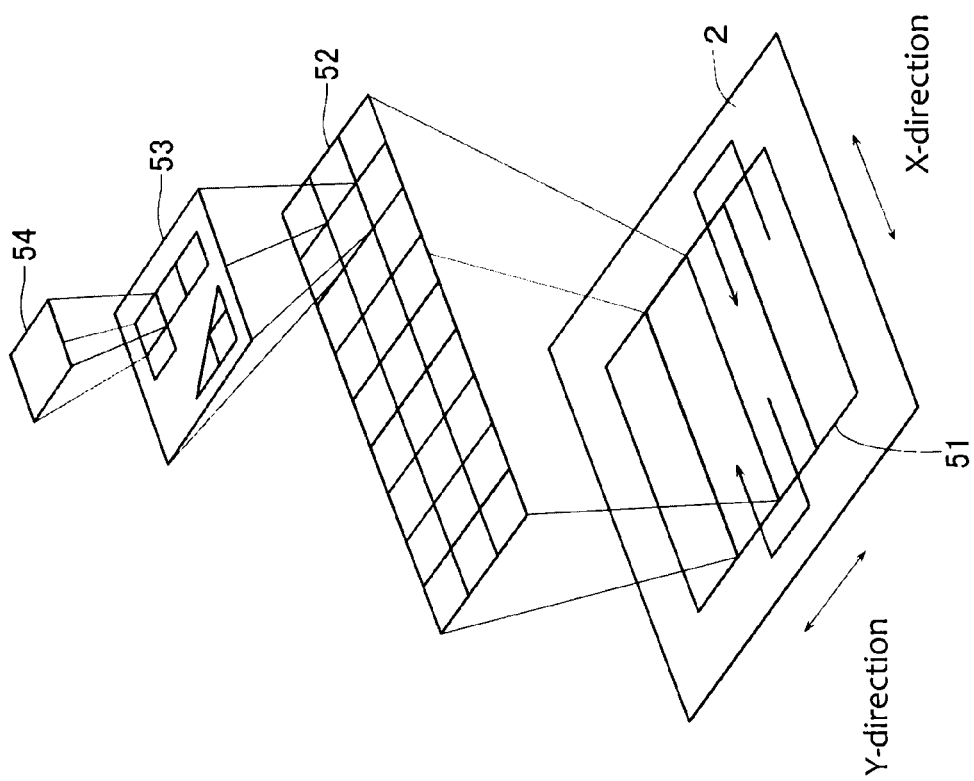
FIG. 3 is a schematic diagram illustrating an electron beam writing method.

FIG. 3 is a schematic diagram illustrating an electron beam writing method. As shown in this figure, a pattern 51 to be written on the mask 2 is divided into strip-shaped frames 52. The pattern is written on the mask 2 by an electron beam 54 on a frame 52 basis while the stage 3 is continuously moved in one direction (e.g., the X-direction). Each frame 52 is divided into sub-deflection regions 53, and the pattern writing is performed only on a selected portion or portions of the sub-deflection regions 53 by the electron beam 54. It will be noted that the frames 52 are strip-shaped writing fields whose size is determined by the deflection width of the main deflector 15, and the sub-deflection regions 53 are unit writing fields whose size is determined by the deflection width of the sub-deflector 16.

The main deflector 15 moves the electron beam to a target sub-deflection region 53, and the sub-deflector 16 scans the electron beam over the sub-deflection region 53 for pattern writing. That is, the electron beam 54 is first moved to a predetermined sub-deflection region 53 by the main deflector 15 and then positioned at a target writing position in the sub-deflection region 53 by the sub-deflector 16. Further, the shape and size of the electron beam 54 are controlled by the shaping deflector 14 and the beam shaping apertures 17 and 18. Writing is then performed on the sub-deflection region 53 while the stage 3 is continuously moved in one direction. Upon completion of the writing on this sub-deflection region 53, the writing on the next sub-deflection region 53 is initiated. Further, upon completion of the writing on all the sub-deflection regions 53 in the current frame 52, the stage 3 is moved one step in a direction perpendicular to the direction of the above continuous movement of the stage 3 (e.g., in the Y-direction) and then the next frame is subjected to a writing operation. This procedure is repeated to write on one frame 52 after another.

Referring now to FIG. 2, reference numeral 20 denotes an input unit through which pattern writing data for the mask 2 is input from a magnetic disk (a storage medium) to the electron beam writing apparatus. The pattern writing data read from the input unit 20 is temporarily stored in pattern memory 21 on a frame 52 basis. The pattern data for each frame 52 stored in the pattern memory 21, that is, frame information which includes pattern writing position data, pattern shape data, etc. is corrected by a writing data correcting unit 31 and then sent to a pattern data decoder 22 and a writing data decoder 23 which serve as data analysis units.

Figure 4:
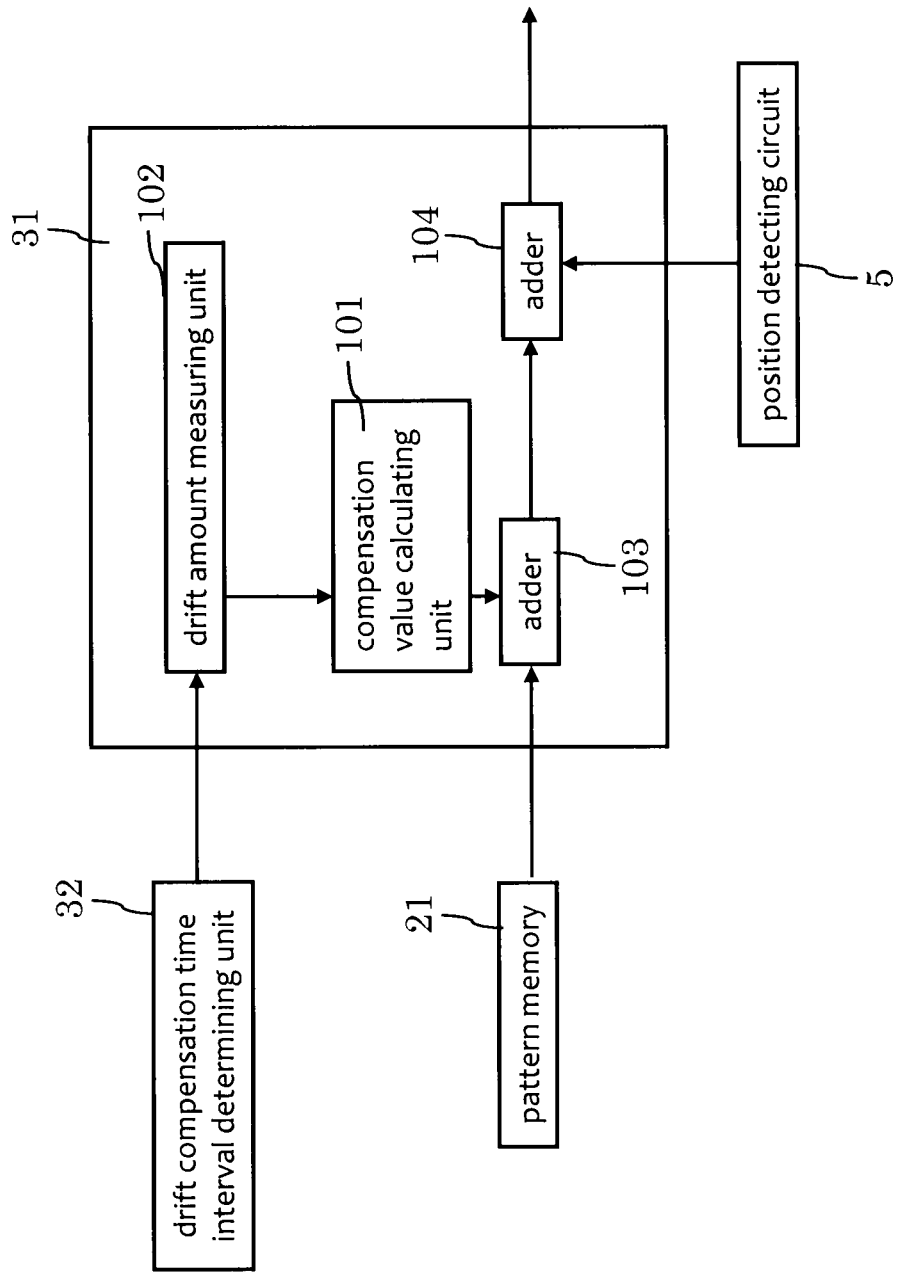
FIG. 4 is a schematic diagram showing the configuration of a writing data correcting unit of the embodiment.

The writing data correcting unit 31 performs a drift compensation on original design value data. Specifically, as shown in FIG. 4, a compensation value calculating unit 101 calculates a compensation value for drift compensation based on the amount of drift measured by a drift amount measuring unit 102. An adder 103 then adds or combines the design value data and the compensation value data. It should be noted that the drift compensation is made at time intervals specified by a drift compensation time interval determining unit 32.

According to the present embodiment, based on the pattern writing data input to the input unit 20, a control computer 19 divides a predetermined region on which writing is effected by the electron beam into smaller regions each consisting of one or the same number of frames. The control computer 19 then determines the areal density of the pattern to be written on each smaller region. Alternatively, this determination may be made externally and the determination results may be input to the input unit 20. Next, the drift compensation time interval determining unit 32 determines the amount of change in pattern areal density between each two adjacent smaller regions, and groups the smaller regions in the predetermined region into region groups depending on whether or not the amount of change in pattern areal density is greater than a predetermined value. A time profile for compensating for the drift of the electron beam is then determined for each region group.

The writing data correcting unit 31 modifies the design value data to which drift compensation has been applied so that it reflects the position of the stage 3. More specifically, the position data of the stage 3 obtained by the position detecting circuit 5 is sent to the writing data correcting unit 31 in which, as shown in FIG. 4, the adder 104 adds the position data to the design value data to which the drift compensation has been applied. The combined data is sent to the pattern data decoder 22 and the writing data decoder 23.

The information from the pattern data decoder 22 is sent to a blanking circuit 24 and a beam shaper driver 25. Specifically, the pattern data decoder 22 generates blanking data based on the above combined data and sends it to the blanking circuit 24. The pattern data decoder 22 also generates the desired beam size data and sends it to the beam shaper driver 25. The beam shaper driver 25 then applies a predetermined deflection signal to the shaping deflector 14 in the electron beam optical system 10 to adjust the size of the electron beam 54.

Referring now to FIG. 2, a deflection control unit 30 is connected to a settling time determining unit 29 which is connected to a sub-deflection region deflection amount calculating unit 28. The sub-deflection region deflection amount calculating unit 28 is also connected to the pattern data decoder 22. Further, the deflection control unit 30 is also connected to the blanking circuit 24, the beam shaper driver 25, a main deflector driver 26, and a sub-deflector driver 27.

The output from the writing data decoder 23 is sent to the main deflector driver 26 and the sub-deflector driver 27. The main deflector driver 26 then applies a predetermined deflection signal to the main deflector 15 in the electron beam optical system 10 to deflect the electron beam 54 to a predetermined main deflection position. Further, the sub-deflector driver 27 applies a predetermined sub-deflection signal to the sub-deflector 16 to write on a sub-deflection region 53.

A writing method using the electron beam writing apparatus will now be described.

First, the mask 2 is placed on the stage 3 in the writing chamber 1. Next, the position detecting circuit 5 detects the position of the stage 3, and in response to a signal from the control computer 19, the stage drive circuit 4 moves the stage 3 to position where writing is possible.

The electron gun 6 then emits the electron beam 54. The emitted electron beam 54 is focused by an illumination lens 7. The blanking deflector 13 operates so that the mask 2 is either irradiated with the electron beam 54 or not irradiated with the electron beam 54.

The electron beam 54 directed to the first aperture 17 passes through the opening of the first aperture 17 and is deflected by the shaping deflector 14 controlled by the beam shaper driver 25. The electron beam 54 is then passed through the opening of the second aperture 18 so that the beam 54 assumes the desired shape and size. This beam shape corresponds to the smallest writing area on the mask 2 that can be independently irradiated with the electron beam 54.

After thus being shaped into the desired beam shape, the electron beam 54 is reduced in size by the reducing lens 11. The impinging position of the electron beam 54 on the mask 2 is adjusted by the main deflector 15 and the sub-deflector 16 controlled by the main deflector driver 26 and the sub-deflector driver 27, respectively. The main deflector 15 moves the electron beam 54 to a sub-deflection region 53 on the mask 2, and the sub-deflector 16 positions the electron beam 54 at a writing position in the sub-deflection region 53.

When writing on the mask 2 with the electron beam 54, the beam 54 is caused to scan the mask 2 while the stage 3 is moved in one direction. Specifically, a pattern is written in each sub-deflection region 53 while the stage 3 is moved in one direction. Upon completion of the writing on all the sub-deflection regions 53 in one frame 52, the stage 3 is moved to a new frame 52 and the above procedure is repeated to write on the new frame 52.

After the completion of the writing on all frames 52 of the mask 2, the mask is replaced by a new mask and the above writing method is repeated.

The writing control by the control computer 19 will now be described.

The control computer 19 reads pattern writing data for a mask from a magnetic disk through the input unit 20. The read pattern writing data is temporarily stored in the pattern memory 21 on a frame 52 basis.

The pattern writing data for each frame 52 stored in the pattern memory 21, that is, frame information which includes pattern writing position data, pattern shape data, etc., is corrected by the writing data correcting unit 31, as described above, and then sent to the sub-deflection region deflection amount calculating unit 28, the blanking circuit 24, the beam shaper driver 25, the main deflector driver 26, and the sub-deflector driver 27 through the pattern data decoder 22 and the writing data decoder 23 which serve as data analysis units.

The pattern data decoder 22 produces blanking data based on the pattern writing data and sends it to the blanking circuit 24. The pattern data decoder 22 also produces the desired beam shape data based on the pattern writing data and sends it to the sub-deflection region deflection amount calculating unit 28 and the beam shaper driver 25.

The sub-deflection region deflection amount calculating unit 28 calculates the amount of electron beam deflection (or electron beam travel distance) for each shot in the sub-deflection regions 53 based on the beam shape data produced by the pattern data decoder 22. The resultant information is sent to the settling time determining unit 29, which determines a settling time corresponding to the distance of travel of the electron beam due to the sub-deflection.

The settling time determined by the settling time determining unit 29 is sent to the deflection control unit 30, and the deflection control unit 30 sends it to the blanking circuit 24, the beam shaper driver 25, the main deflector driver 26, or the sub-deflector driver 27, depending on the pattern writing timing.

The beam shaper driver 25 applies a predetermined deflection signal to the shaping deflector 14 in the electron beam optical system 10 to adjust the shape and size of the electron beam 54.

The writing data decoder 23 generates, based on the pattern writing data, data for positioning the electron beam in a sub-deflection region 53, and sends it to the main deflector driver 26. The main deflector driver 26 then applies a predetermined deflection signal to the main deflector 15 to deflect the electron beam 54 to a predetermined position in the sub-deflection region 53.

The writing data decoder 23 also generates, based on the pattern writing data, a control signal for the sub-deflector 16 to scan the beam. This control signal is sent to the sub-deflector driver 27 which then applies a predetermined sub-deflection signal to the sub-deflector 16. The sub-deflector 16 scans the radiated electron beam 54 over the sub-deflection region 53 for pattern writing after the set settling time has elapsed.

It will be understood that the present invention is not limited to the embodiment described above since various alterations may be made thereto without departing from the spirit and scope of the invention.

For example, in the present embodiment, the drift compensation time interval determining unit 32 determines the time profile for compensating for the drift of the electron beam. In other embodiments of the present invention, however, this time profile may be determined outside the electron beam writing apparatus. In this case, information about the determined time profile is input to the input unit 20. The control computer 19 then controls the writing data correcting unit 31 to compensate for the drift in accordance with this time profile.

Further, although the present embodiment uses an electron beam, it is to be understood that the present invention is not limited to electron beams, but may be applied to other charged particle beams such as ion beams.

The features and advantages of the present invention may be summarized as follows.

According to the first aspect of the present invention, a predetermined region on which writing is effected by a charged particle beam is divided into smaller regions each consisting of one or the same number of frames, and the areal density of a pattern to be written on each smaller region is determined. Next, a determination is made of the amount of change in pattern areal density between each two adjacent smaller regions, and these smaller regions in the predetermined region are grouped into region groups depending on whether or not the amount of change in pattern areal density is greater than a predetermined value. A time profile for compensating for the drift of the charged particle beam is then determined for each region group. This improves the accuracy of the drift compensation while preventing a reduction in the throughput, thus providing a charged particle beam writing method capable of writing with high accuracy.

According to the second aspect of the present invention, a predetermined region on which writing is effected by a charged particle beam is divided into a plurality of region groups by grouping means, and a time profile for compensating for the drift of the charged particle beam is determined for each region group. A pattern is then written on the predetermined region while compensating for the drift of the charged particle beam in accordance with this time profile. This improves the accuracy of the drift compensation while preventing a reduction in the throughput, making it possible to provide a charged particle beam writing apparatus capable of writing with high accuracy.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-035275, filed on Feb. 18, 2009 including specification, claims, drawings and summary, on which the Convention priority of the present application is based, are incorporated herein by reference in its entirety.

What is claimed is:

1. A charged particle beam writing apparatus which divides a predetermined region on which writing is effected by a charged particle beam into a plurality of region groups and writes a pattern on the predetermined region while compensating the CPB drift at regular time intervals in accordance with a time-profile, said time interval being determined for each region group, said charged particle beam writing apparatus comprising:
    grouping means for dividing said predetermined region into smaller regions each consisting of one or the same number of frames, obtaining data indicative of the areal density of a pattern to be written on each smaller region, determining the amount of change in pattern areal density between each two adjacent smaller regions, and grouping said smaller regions into region groups depending on whether or not said amount of change is greater than a predetermined value.

2. The charged particle beam writing apparatus according to claim 1, further comprising:
    areal density determining means for dividing said predetermined region into smaller regions each consisting of one or the same number of frames, and determining the areal density of a pattern to be written on each smaller region.

3. The charged particle beam writing apparatus according to claim 1, wherein:
   said predetermined region includes a first predetermined region and a second predetermined region, and said writing is to be performed on said first and second predetermined regions in that order; and
   the amounts of change in pattern areal density determined by said grouping means include the amount of change in pattern areal density between the last smaller region of said first predetermined region on which said writing is to be performed and the first smaller region of said second predetermined region on which said writing is to be performed.

4. The charged particle beam writing apparatus according claim 3, further comprising:
   areal density determining means for dividing said predetermined region into smaller regions each consisting of one or the same number of frames, and determining the areal density of a pattern to be written on each smaller region.

* * * * *